United States Patent
Choi

(10) Patent No.: US 8,673,521 B2
(45) Date of Patent: Mar. 18, 2014

(54) BLANK SUBSTRATES FOR EXTREME ULTRA VIOLET PHOTO MASKS AND METHODS OF FABRICATING AN EXTREME ULTRA VIOLET PHOTO MASK USING THE SAME

(75) Inventor: Chung Seon Choi, Jeonju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 13/457,366

(22) Filed: Apr. 26, 2012

(65) Prior Publication Data

US 2012/0276475 A1     Nov. 1, 2012

(30) Foreign Application Priority Data

Apr. 27, 2011   (KR) .................. 10-2011-0039821

(51) Int. Cl.
*G03F 1/24*     (2012.01)
*G03F 1/22*     (2012.01)

(52) U.S. Cl.
USPC ............................................................ 430/5

(58) Field of Classification Search
USPC .......... 430/5, 322, 394; 378/35; 428/428, 430
See application file for complete search history.

(56) References Cited

U.S. PATENT DOCUMENTS

2002/0119380 A1*   8/2002   Zemen et al. .................... 430/5
2006/0147818 A1*   7/2006   Lee ................................... 430/5

\* cited by examiner

*Primary Examiner* — Stephen Rosasco
(74) *Attorney, Agent, or Firm* — William Park & Associates Patent Ltd.

(57) ABSTRACT

Blank substrates for an extreme ultraviolet (EUV) photo mask are provided. The blank substrate includes a substrate, a reflection layer on the substrate, an absorption layer on the reflection layer opposite to the substrate, and a critical dimension (CD) compensation layer on the absorption layer opposite to the reflection layer. Methods of forming an extreme ultraviolet (EUV) photo mask using the blank substrate are also provided.

20 Claims, 3 Drawing Sheets

BLANK SUBSTRATES FOR EXTREME ULTRA VIOLET PHOTO MASKS AND METHODS OF FABRICATING AN EXTREME ULTRA VIOLET PHOTO MASK USING THE SAME

CROSS-REFERENCES TO RELATED APPLICATIONS

The present application claims priority under 35 U.S.C 119(a) to Korean Application No. 10-2011-0039821, filed on Apr. 27, 2011, in the Korean intellectual property Office, which is incorporated herein by reference in its entirety set forth in full.

BACKGROUND

1. Field of Invention

The present disclosure relates generally to photo masks used in fabrication of semiconductor devices and more particularly to blank substrates for extreme ultraviolet (EUV) photo masks and fabricating an extreme ultraviolet (EUV) photo mask using the same.

2. Related Art

To accomplish greater degree of high integration, continuous reduction of the light wavelength in photolithography is imperative in order to improve the resolution of the patterns transferred to a semiconductor wafer. A photolithography apparatus utilizes lights such as the visible rays, ultraviolet (UV) rays, deep ultraviolet (DUV) rays, etc. The deep ultraviolet (DUV) rays were widely used as the source lights of the photolithography apparatus, because about 365 nanometers (nm), 248 nm, or 193 nm wavelengths of the deep ultraviolet (DUV) rays are relatively shorter than the wave lengths of the visible rays and the ultraviolet (UV) rays. In particular, the argon fluoride (ArF) lasers generating the DUV lights of about 193 nm wave length have been widely utilized in many photolithography apparatuses. However, the argon fluoride (ArF) lasers are not known to produce satisfactory results when transferring the fine patterns having the line widths of about 70 nm or the less to a wafer.

The immersion photolithography techniques using the ArF lasers have been proposed for purposes of improving the resolution of the patterns. The immersion photolithography techniques utilize an immersion liquid provided between the wafer and the lens module. Nevertheless, an effective photolithography technique for transferring the small patterns having the line widths of about 40 nm or the less are yet to be found. It is an on-going process to develop the next generation lithography (NGL) techniques that would transfer the fine and small patterns. Some examples of the next generation lithography (NGL) are the extreme ultraviolet (EUV) lithography techniques, the electron beam lithography techniques, the proximity electron beam lithography techniques, the proximity x-ray lithography techniques, and the ion beam lithography techniques. The EUV lithography techniques may utilize a light having of about 13 nm to about 14 nm wave length and an anisometric mirror optical system.

SUMMARY

The embodiments are directed to blank substrates for forming extreme ultraviolet (EUV) photo masks and methods of fabricating an extreme ultraviolet (EUV) photo mask using the blank substrate.

According to an embodiment, a blank substrate used in formation of an extreme ultraviolet (EUV) photo mask includes, inter alia, a substrate, a reflection layer on the substrate, an absorption layer on the reflection layer opposite to the substrate, and a critical dimension (CD) compensation layer on the absorption layer opposite to the reflection layer.

The reflection layer may include at least one molybdenum (Mo) layer and at least one silicon (Si) layer that are alternately and repeatedly formed or, for example, stacked.

The CD compensation layer may include a molybdenum silicon nitride (MoSiN) layer.

The blank substrate may further include a buffer layer between the reflection layer and the absorption layer.

The blank substrate may further include a resist layer on the CD compensation layer opposite to the absorption layer.

Further, a method of fabricating an extreme ultraviolet (EUV) photo mask includes, inter alia, preparing a blank substrate including a reflection layer, a buffer layer, an absorption layer, a critical dimension (CD) compensation layer and a resist layer that are sequentially staked on a substrate, patterning the resist layer to form resist patterns exposing at least one portion of the CD compensation layer, selectively removing the exposed CD compensation layer to form CD compensation patterns, measuring a critical dimension of the CD compensation patterns to calculate a CD variation between the critical dimension of the CD compensation patterns and a design critical dimension, etching the CD compensation patterns to compensate the critical dimension of the CD compensation patterns if the calculated CD variation is out of a predetermined allowable range, and etching the absorption layer and the buffer layer using the etched CD compensation patterns as etch masks to form absorption layer patterns and buffer patterns.

The CD compensation layer may be formed of a molybdenum silicon nitride (MoSiN) layer.

Etching the CD compensation patterns may be performed using a dry etching process.

The method may further include removing the etched CD compensation patterns after formation of the absorption layer patterns and the buffer patterns.

The resist patterns and the CD compensation patterns may be formed to have a critical dimension which is greater than the design critical dimension.

BRIEF DESCRIPTION OF THE DRAWINGS

The above and other features and advantages of the disclosure will become more apparent in view of the attached drawings and accompanying detailed description.

DESCRIPTION OF SPECIFIC EMBODIMENTS

Figure 1:
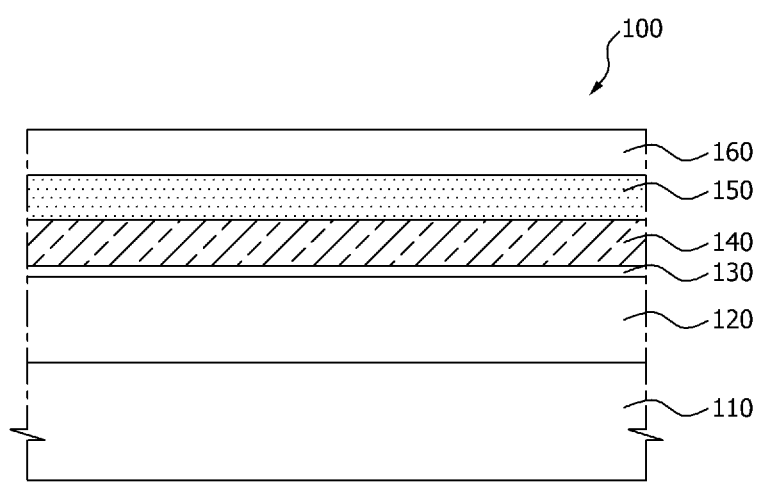
FIG. 1 is a cross sectional view illustrating a blank substrate used in formation of an extreme ultraviolet (EUV) photo mask according to an embodiment.

Various embodiments will be described more fully hereinafter with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete and will convey the scope of the disclosure to those skilled in the art. In the drawings, the sizes and relative sizes of layers and regions may be exaggerated for clarity. The same reference numerals or the same reference designators denote the same elements throughout the specification.

As used herein the term "and/or" includes any and all combinations of one or more of the associated listed items.

Each of the extreme ultraviolet (EUV) photo masks used in the EUV lithography techniques may have a light reflecting type structure in contrast to a light transmitting type structure. For example, the EUV photo mask may include a substrate, a reflection layer stacked on the substrate, and an absorption pattern on the reflection layer. The reflection layer may be a laminated layer having a plurality of stacked layers. For example, the reflection layer may include molybdenum (Mo) layers and silicon layers that are alternately and repeatedly formed or, for example, stacked. When the EUV light is irradiated onto the EUV photo mask, the absorption pattern may absorb the EUV light and the reflection layer exposed by the absorption pattern may reflect the EUV light. The reflected EUV light may be irradiated onto a wafer through an optical system. Thus, the shape of the absorption pattern may be transferred onto a wafer.

The EUV photo mask may be fabricated using a blank substrate including a reflection layer, a buffer layer, an absorption layer, and a photoresist layer that are sequentially formed or, for example, stacked on a substrate. Specifically, the EUV photo mask may be fabricated by exposing and developing the photoresist layer of the blank substrate to form a photoresist pattern and by etching the absorption layer and the buffer layer using the photoresist pattern as an etch mask to form an absorption layer pattern. In the above-described processes, if the absorption layer pattern is formed to have a critical dimension (CD), for example, of a size that is different from the design CD value, it may be difficult to compensate the critical dimension (CD) of the absorption layer pattern.

FIG. 1 is a cross sectional view illustrating a blank substrate for forming an extreme ultraviolet (EUV) photo mask according to an embodiment. Referring to FIG. 1, a blank substrate 100 for an extreme ultraviolet (EUV) photo mask may include a substrate 110 and a plurality of layers formed on the substrate 110. The plurality of layers formed on the substrate 110 may include a reflection layer 120, a buffer layer 130, an absorption layer 140, a critical dimension (CD) compensation layer 150, and a resist layer 160 formed on the substrate 110 as shown in FIG. 1. When the extreme ultraviolet (EUV) light is irradiated onto the substrate 110, the substrate 110 may thermally expand, and this may likely cause critical dimension (CD) variances of the patterns. Thus, a relatively low coefficient of thermal expansion is one desirable characteristic of the substrate 110 to minimize the CD variances of the patterns. For example, the substrate 110 may be a silicon substrate or a glass substrate having a relatively low coefficient of thermal expansion. The reflection layer 120 should reflect an extreme ultraviolet (EUV) light in a certain reflectance, for example, in a reflectance of at least sixty percent. In an embodiment, the reflection layer 120 may, for example, include about thirty material layers to about sixty material layers that are sequentially formed on another. Specifically, the reflection layer 120 may include a number of first layers having a relatively high diffractive index and a number of second layers having a relatively low diffractive index that are repeatedly formed on another in an alternating manner (e.g., a first layer, then a second layer, then another first layer, etc.) to obtain a high reflectance of at least sixty percent. For example, the reflection layer 120 may have a thickness of about 270 nm to about 290 nm and may include about forty molybdenum (Mo) layers and about forty silicon (Si) layers that are repeatedly formed on another in an alternating manner (e.g., a Mo layer, a Si layer, then another Mo layer, etc.). Alternatively, the reflection layer 120 may include a plurality of ruthenium (Ru) layers and a plurality of silicon (Si) layers that are repeatedly formed on another in an alternating manner (e.g., a Ru layer, a Si layer, then another Ru layer, etc.). Alternatively, the reflection layer 120 may include three or more layers that are alternately and repeatedly formed on another in an alternating manner (e.g., a first layer, a second layer, a third layer, then another first layer, etc.).

The buffer layer 130 may include a silicon oxide layer having a thickness of about 50 nm. The absorption layer 140 may have a thickness of about 100 nm and may include an aluminum (Al) layer, a chrome (Cr) layer, a tantalum nitride (TaN) layer, or a tungsten (W) layer. The CD compensation layer 150 may be patterned to form the CD compensation patterns, and the absorption layer 140 may be etched using the CD compensation patterns as the etch masks to form the absorption layer patterns. If the size (e.g., a critical dimension) of the CD compensation patterns is out of a predetermined range, the CD compensation patterns may be reworked or resized, for example, for size reduction or removal, before etching the absorption layer 140. That is, the CD compensation layer 150 may be used to compensate the sizes of the absorption layer patterns, when needed, before completing the EUV photo mask. In an embodiment, the CD compensation layer 150 may be formed of a molybdenum silicon nitride (MoSiN) layer. In the event the CD compensation patterns are not removed even after completing the EUV photo mask, the CD compensation patterns should absorb the EUV light.

Figure 2:
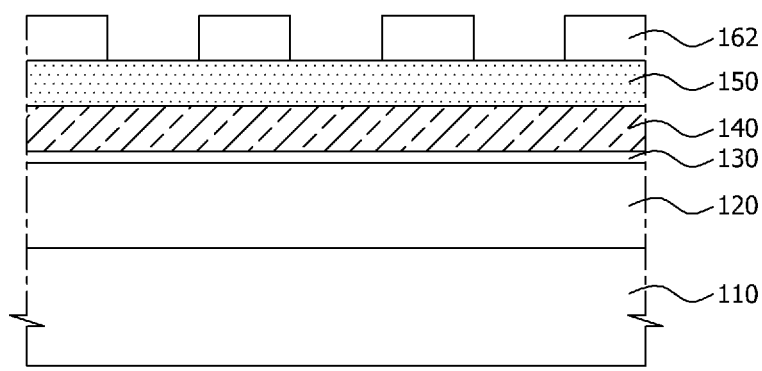
FIGS. 2 to 5 are cross sectional views illustrating a method of fabricating an extreme ultraviolet (EUV) photo mask using the blank substrate of FIG. 1.

FIGS. 2 to 5 are cross sectional views for illustrating a method of fabricating an extreme ultraviolet (EUV) photo mask using the blank substrate of FIG. 1. Referring to FIG. 2, the resist layer (160 of FIG. 1) may be patterned to form the resist patterns 162 exposing the predetermined portions of the CD compensation layer 150. The resist patterns 162 may be formed by applying an exposure process to the resist layer 160 and applying a development process to the exposed resist layer.

Figure 3:
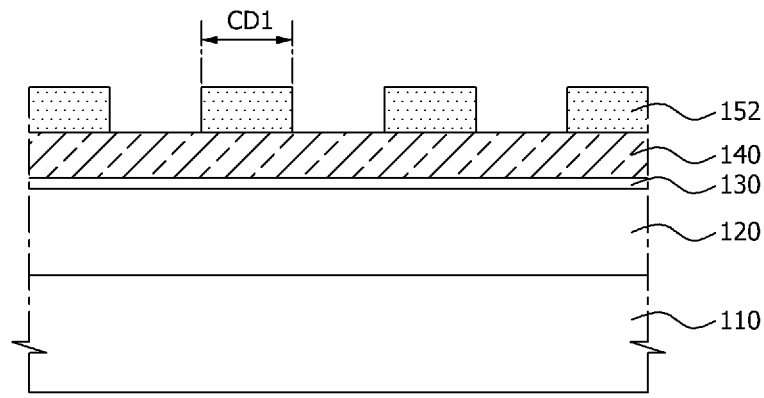

Referring to FIG. 3, the CD compensation layer (150 of FIG. 2) may be etched using the resist patterns 162 as the etch masks, thereby forming the CD compensation patterns 152 that exposes the predetermined portions of the absorption layer 140. The CD/compensation layer 150 may be etched using a dry etching process. After forming the CD compensation patterns 152, the resist patterns 162 may be removed, and a first critical dimension CD1 of the CD compensation patterns 152 may be measured. The first critical dimension CD1 may be measured by using, for example, a scanning electron microscope (SEM); however, the measurement equipment is not be limited to a SEM only.

The first critical dimension CD1 of the CD compensation patterns 152 may depend on the critical dimension of the resist patterns (162 of FIG. 2). Further, the first critical dimension CD1 of the CD compensation patterns 152 may directly affect a critical dimension of the absorption layer patterns to be formed in a subsequent process. The resist patterns 162 are formed to have the critical dimension that is substantially as same as the design CD value. Then, the first critical dimension CD1 of the CD compensation patterns 152 would also equal to the design CD value. However, the CD compensation patterns 152 may be formed such that the critical dimension thereof is different from the design CD value. For example, when the critical dimension of the resist patterns 162 is greater than the design CD value, the first critical dimension CD1 of the CD compensation patterns 152 may also be greater than the design CD value. Then, there may be a CD variation or a CD difference between the first critical dimension CD1 of the CD compensation patterns 152 and the design CD value. Accordingly, the first critical dimension CD1 of the CD compensation patterns 152 should be reduced in a subsequent process to be consistent with the design CD value.

Figure 4:
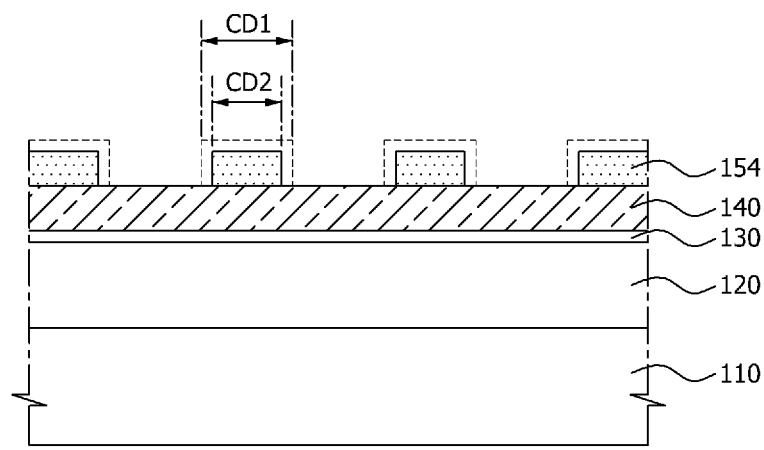

Referring to FIG. 4, after measuring the first critical dimension CD1 of the CD compensation patterns 152, the measured first critical dimension CD1 may be compared with the design CD value to determine whether there exists a CD difference or variation between the first critical dimension CD1 and the design CD value. If there exists a CD difference or variation, the difference is measured. If the first critical dimension CD1 is consistent with the design CD value, a CD compensation process of the CD compensation patterns 152 may be omitted. In contrast, if the CD difference or the CD variation between the first critical dimension CD1 and the design CD value is out of a predetermined allowable range, the CD compensation process of the CD compensation patterns 152 may be performed. For example, if the first critical dimension CD1 of the CD compensation patterns 152 is greater than the design CD value, the CD compensation patterns 152 may be etched to reduce the first critical dimension CD1 thereof. In an embodiment, the CD compensation patterns 152 may be etched using a dry etching process. As a result of the compensation process, the CD compensation patterns 152 may be shrunk to produce CD compensation patterns 154 having a second critical dimension CD2 which is substantially equal to the design CD value. In FIG. 4, the CD compensation patterns 152 before the compensation process are illustrated by dotted lines. As illustrated in FIG. 4, the compensation process may reduce both the height and width of each of the CD compensation patterns 152. Further, it may be possible that buffer patterns (not shown) may be formed on respective ones of the CD compensation patterns 152 before the compensation process. In this case, even though the compensation process is performed, the CD compensation patterns 154 may still maintain the height of the CD compensation patterns 152.

Figure 5:
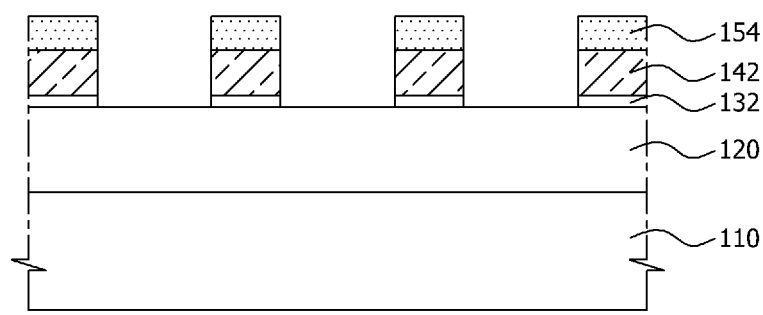

Referring to FIG. 5, the absorption layer (140 of FIG. 4) and the buffer layer (130 of FIG. 4) are etched using the CD compensation patterns 154 as etch masks, thereby forming adsorption layer patterns 142 and buffer patterns 132. The buffer patterns 132 and the adsorption layer patterns 142 may have openings that expose some portions of the reflection layer 120. If an extreme ultraviolet (EUV) ray is irradiated onto the exposed reflection layer 120, the exposed reflection layer 120 may reflect the EUV ray onto a wafer. In contrast, if the EUV ray is irradiated onto the CD compensation patterns 154, the EUV ray may not be reflected onto the wafer because the CD compensation patterns 154 and the absorption layer patterns 142 absorb the EUV ray. In the event that the CD compensation patterns 154 are formed of a material having a property absorbing the EUV ray, the EUV ray irradiated onto the absorption layer patterns 142 may be primarily absorbed into the CD compensation patterns 154. Thus, the amount of the EUV ray reaching the absorption layer patterns 142 may be reduced to increase the EUV ray absorptivity of the absorption layer patterns 142. Accordingly, the substrate including the CD compensation patterns 154 may be used as a EUV photo mask.

Figure 6:
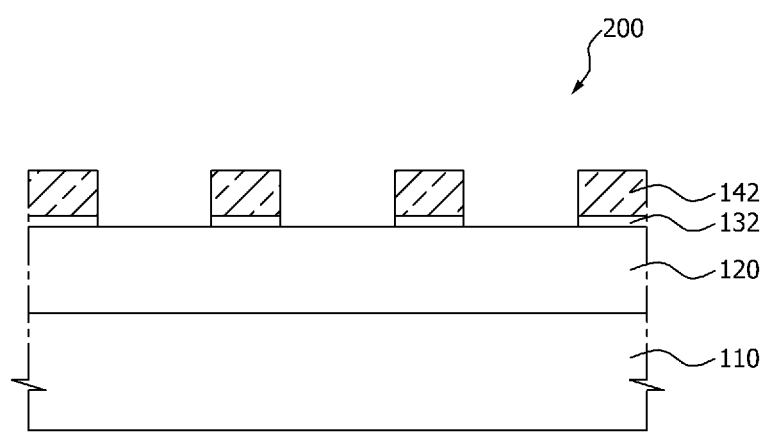
FIG. 6 is a cross sectional view illustrating an extreme ultraviolet (EUV) photo mask obtained by removing a critical dimension compensation pattern from the extreme ultraviolet (EUV) photo mask of FIG. 5.

FIG. 6 is a cross sectional view for illustrating an extreme ultraviolet (EUV) photo mask 200 obtained by removing a critical dimension compensation pattern 154 from an extreme ultraviolet (EUV) photo mask shown in FIG. 5. As described with reference to FIG. 5, an EUV photolithography process may be performed using the substrate with the CD compensation patterns 154 as an EUV photo mask. However, even though the CD compensation patterns 154 are removed from the substrate, the substrate without the CD compensation patterns 154 may still be used as the EUV photo mask.

According to the embodiments of the present invention, a critical dimension (CD) compensation layer may be disposed on an absorption layer of a blank substrate for an extreme ultraviolet (EUV) photo mask. The CD compensation layer may be patterned to form CD compensation patterns, and the absorption layer may be etched using the CD compensation patterns as etch masks to form absorption layer patterns. Thus, when a critical dimension of the CD compensation patterns is greater than a design CD, the CD compensation patterns may be reworked or resized to compensate the CD thereof before the absorption layer is etched. Accordingly, a critical dimension of the absorption layer patterns can be compensated even while the extreme ultraviolet (EUV) photo mask is being fabricated.

Further, the CD compensation patterns may remain without removal thereof during the fabrication of the extreme ultraviolet (EUV) photo mask. In this case, the EUV ray absorptivity of the absorption layer patterns can be more improved because of the presence of the CD compensation patterns.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A blank substrate for an extreme ultraviolet (EUV) photo mask, the blank substrate comprising:
   a substrate;
   a reflection layer formed on the substrate;
   an absorption layer formed on the reflection layer; and
   a critical dimension (CD) compensation layer formed on the absorption layer.

2. The blank substrate of claim 1, wherein the substrate is one of a silicon substrate or a glass substrate having a low coefficient of thermal expansion.

3. The blank substrate of claim 1, wherein the reflection layer is capable of reflecting an EUV light in a reflectance of at least sixty percent.

4. The blank substrate of claim 1, wherein the reflection layer comprises a plurality of first layers having a first diffractive index and a plurality of second layers have a second diffractive index, wherein the first and second layers are repeatedly formed on another in an alternating manner, wherein the first diffractive index is higher than the second diffractive index so as to obtain a reflectance of at least sixty percent.

5. The blank substrate of claim 4, wherein the reflection layer comprises thirty to sixty layers of first and second layers.

6. The blank substrate of claim 1, wherein the reflection layer comprises at least one molybdenum (Mo) layer and at least one silicon (Si) layer that are formed on another in an alternating manner.

7. The blank substrate of claim 6, wherein the reflection layer has a thickness of about 270 nanometer to about 290 nanometer and comprises about forty Mo layers and about forty Si layers.

8. The blank substrate of claim 1, wherein the reflection layer comprise at least one ruthenium (Ru) layer and at least one (Si) layer that are formed on another in an alternating manner.

9. The blank substrate of claim 8, wherein the reflection layer has thickness of about 270 nanometer to about 290 nanometer and comprises about forth Ru layers and about forty Si layers.

10. The blank substrate of claim 1, wherein the reflection layer comprises three or more layers, each layer made of a material having a diffractive coefficient that are different from each other, wherein the three or more layers are formed on another in an alternating manner.

11. The blank substrate of claim 1, wherein the absorption layer comprises one or more of an aluminum (Al) layer, a chrome (Cr) layer, a tantalum nitride (TaN) layer, and a tungsten (W) layer.

12. The blank substrate of claim 1, wherein the CD compensation layer includes a molybdenum silicon nitride (MoSiN) layer.

13. The blank substrate of claim 1, further comprising a buffer layer between the reflection layer and the absorption layer.

14. The blank substrate of claim 13, wherein the buffer layer comprises a silicon oxide layer having a thickness of about 50 nanometer.

15. The blank substrate of claim 1, further comprising a resist layer on the CD compensation layer.

16. A method of forming an extreme ultraviolet (EUV) photo mask, the method comprising:
    preparing a blank substrate comprising a reflection layer, a buffer layer, an absorption layer, a critical dimension (CD) compensation layer and a resist layer that are formed on a substrate;
    patterning the resist layer to form at least one resist pattern by exposing at least one portion of the CD compensation layer;
    selectively removing the exposed portion of the CD compensation layer to form at least one CD compensation pattern;
    comparing a critical dimension of the CD compensation pattern with a design critical dimension to determine a critical dimension variation of the CD compensation pattern;
    when the determined critical dimension variation is outside a predetermined allowable range, selectively removing a portion of the CD compensation pattern to minimize the critical dimension variation; and
    selectively removing portions of the absorption layer and the buffer layer using the etched CD compensation patterns as masks to form at least one absorption layer pattern and at least one buffer pattern.

17. The method of claim 16, wherein the CD compensation layer is formed of a molybdenum silicon nitride (MoSiN) layer.

18. The method of claim 16, wherein selectively removing the CD compensation patterns is performed by using a dry etching process.

19. The method of claim 16, further comprising removing the CD compensation pattern after forming the absorption layer pattern and the buffer pattern.

20. The method of claim 16, wherein the critical dimension of the resist pattern is larger than the design critical dimension and the critical dimension of the CD compensation pattern is larger than the design critical dimension.

* * * * *